(12) United States Patent
Cawley et al.

(10) Patent No.: US 10,802,520 B2
(45) Date of Patent: Oct. 13, 2020

(54) HIGH PERFORMANCE CURRENT SOURCE POWER SUPPLY

(71) Applicant: Keithley Instruments, Inc., Cleveland, OH (US)

(72) Inventors: Kevin Cawley, Sagamore Hills, OH (US); Wayne Goeke, Hudson, OH (US); Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 343 days.

(21) Appl. No.: 13/862,135

(22) Filed: Apr. 12, 2013

(65) Prior Publication Data

US 2014/0306671 A1    Oct. 16, 2014

(51) Int. Cl.
*G05F 1/575*   (2006.01)
*G01R 31/317*   (2006.01)
*H04M 1/24*   (2006.01)

(52) U.S. Cl.
CPC ....... *G05F 1/575* (2013.01); *G01R 31/31721* (2013.01); *H04M 1/24* (2013.01)

(58) Field of Classification Search
CPC . G05F 1/56; G05F 1/561; G05F 1/565; G05F 1/575; G05F 1/59; H02M 3/156; H02M 3/158; H02M 3/1588; H02M 2003/1566; H02M 2001/0025; H02M 2001/0045; Y10S 323/909; G01R 19/00; G01R 19/0038; G01R 19/0084; G01R 19/0092; G01R 31/317; G01R 31/31721; H04M 1/24
USPC ........ 323/205–211, 222–226, 265, 271–275, 323/282–286, 311, 312, 316, 317, 351, 323/909, 280; 363/123–127; 324/537, 324/750.02, 764.01, 602, 73.1, 416, 649, 324/691, 705, 713, 765, 771, 158.1, 324/750.01–750.13, 750.15–750.25; 327/538, 540–544, 563; 333/12;
(Continued)

(56) References Cited

U.S. PATENT DOCUMENTS 5,773,990 A * 6/1998 Wilstrup ............ G01R 31/3004
                                                324/762.02
6,114,912 A   9/2000 Ashby et al.
6,710,583 B2 * 3/2004 Stanescu et al. ............. 323/280
(Continued)

FOREIGN PATENT DOCUMENTS

CN        1932710 A     3/2007
JP     2001-004692 A    1/2001

OTHER PUBLICATIONS

Lowe R. et al., "Optimizing Test Performance of Digital Cellular Products With Ultra-High Speed Power Supplies", Dec. 31, 2000, 11 pages, Cleveland, Ohio.
(Continued)

*Primary Examiner* — Thienvu V Tran
*Assistant Examiner* — Carlos O Rivera-Perez
(74) *Attorney, Agent, or Firm* — Miller Nash Graham & Dunn; Andrew J. Harrington

(57) ABSTRACT

A system can include a device under test (DUT) having a DUT voltage, a cable connected to the DUT, the cable having a cable inductance, and a power supply configured as a current source to provide a wide bandwidth voltage source to the DUT, wherein the DUT voltage is independent of the cable inductance.

10 Claims, 5 Drawing Sheets

(58) Field of Classification Search
USPC .......... 455/67.11, 115.1–115.4, 226.1–226.4, 455/115, 67.1, 127
See application file for complete search history.

(56) References Cited

U.S. PATENT DOCUMENTS

| | | |
|---|---|---|
| 8,217,638 B1 | 7/2012 | Li et al. |
| 2006/0273771 A1* | 12/2006 | van Ettinger ........... G05F 1/575 323/273 |
| 2011/0018549 A1* | 1/2011 | Hashimoto ........ G01R 31/2839 324/537 |
| 2011/0101937 A1* | 5/2011 | Dobkin ................. H02M 3/156 323/282 |
| 2011/0163771 A1* | 7/2011 | Kojima ............ G01R 31/31924 324/750.01 |
| 2012/0001606 A1 | 1/2012 | Chen |

OTHER PUBLICATIONS

Cawley K., "Power supply transient response considerations for testing portable wireless devices", WESCON/96 Anaheim, CA, USA Oct. 22-24, 1996, IEEE, Oct. 22, 1996, pp. 123-126, NY, New York.

"Stabilizing Fast Transient Response Power Supply/Load Circuits", Keithley Application Note Series, Dec. 31, 2007, 6 pages, USA.

Extended European Search Report for European Patent Application No. 14164349.4, dated Oct. 14, 2014, 8 pages, Munich.

\* cited by examiner

HIGH PERFORMANCE CURRENT SOURCE POWER SUPPLY

TECHNICAL FIELD

The disclosed technology relates generally to power supplies and implementations thereof, and more particularly to high-performance power supplies for certain electronic devices such as the cellular phones that require wide-bandwidth power delivered over cables to the device under test (DUT).

BACKGROUND

Certain industries, such as the cellular phone industry, continue to have a need for a fast transient response power supply that has stable voltage in response to fast edge, high current pulses from the device under testing (DUT). Current attempts to solve such a need generally include long inductive cables that cause a demand for high bandwidth of the power supply but also cause stability problems due to the inductance of the cables reacting with the capacitance of the DUT.

FIG. 1 illustrates an example 100 of a current source power supply arrangement. In the example 100, a DUT 102 has a voltage $V_{DUT}$ and impedance $Z_L$. A cable connected to the DUT 102 provides an impedance 104 ($Z_W$). A feedback voltage $V_{FEEDBACK}$ is provided by a feedback loop that includes an operational amplifier (op-amp) 108 and an error amplifier that includes an op-amp 110 that sums the feedback voltage and the digital-to-analog (DAC) voltage $V_{DAC}$ to produce an error voltage $V_{err}$. In the example, $V_{DUT}$ is provided by the following:

$$V_{DUT} = V_0 * \frac{Z_L}{Z_L + 2Z_W}$$

In certain implementations, e.g., cellular phone applications, $Z_L = C_L$ and $Z_L = L_W$, resulting in the following $V_{OUT}$:

$$V_{OUT} = \frac{\frac{1}{SC_L}}{\frac{1}{SC_L} + sL_W} = \frac{1}{1 + S^2 C_L L_W}$$

This creates a second order pole $$fp_1 = fp_2 = \frac{1}{2\pi\sqrt{C_L L_W}}$$

For some cases, $L_W=4$ μH and $C_L=10$ μF, thus resulting in f=25 kHz, which disadvantageously causes loop instability.

Accordingly, there remains a need for a more cable-independent system.

SUMMARY

Embodiments of the disclosed technology generally include power supplies that are designed to respond with a low voltage droop to high speed current pulses, such as those commonly found in cellular phones, and not have stability problems associated with the inductance of long cables. Such embodiments are useful for pulsing-type loads with long cables to the device under test (DUT) that require fast transient response, specifically those with capacitive loads. Such embodiments are also useful to provide high-bandwidth power to a DUT with little impact to the power supply performance by the cabling system or the DUT itself.

DETAILED DESCRIPTION

Embodiments of the disclosed technology are generally directed to a power supply that is designed to power a capacitive device under test (DUT), such as a battery-operated wireless device that requires high-bandwidth performance such as those that have current pulse loading and require extremely fast load regulation at the end of long cables. Such a power supply would serve to simulate the battery to the DUT or provide an arbitrary voltage to a DUT.

Figure 1:
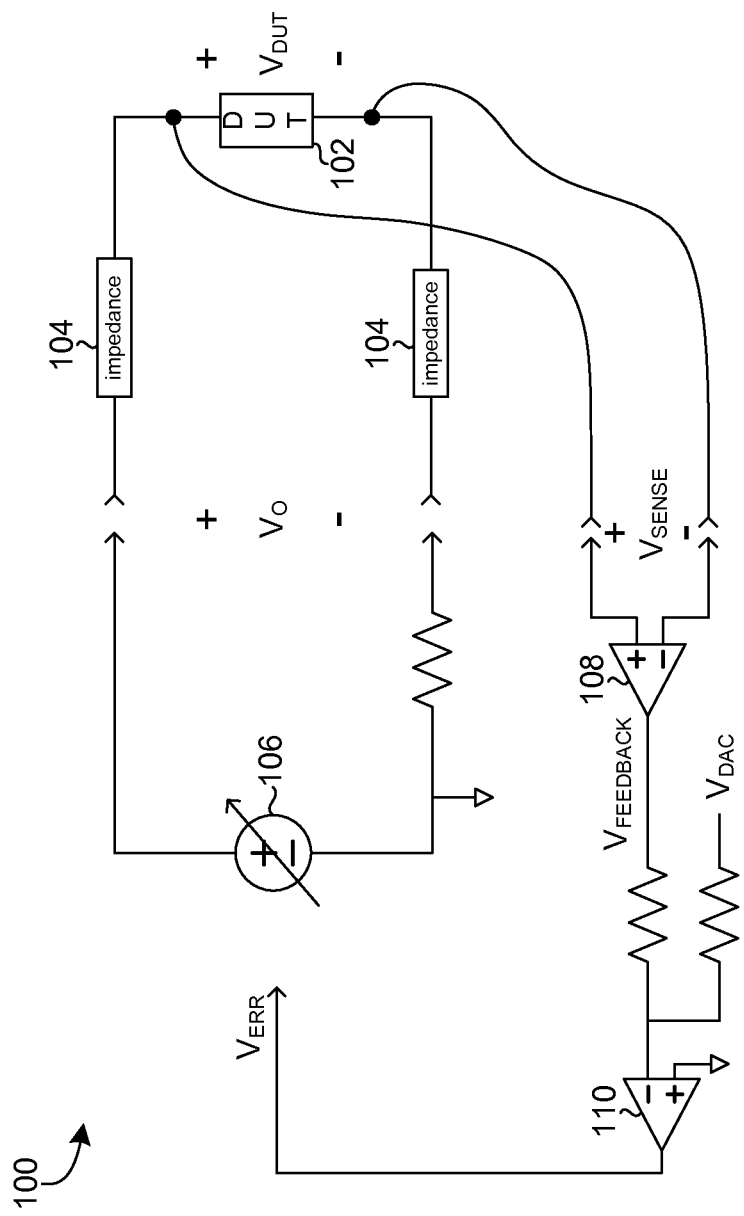
FIG. 1 illustrates an example of a current source power supply arrangement.
Figure 2:
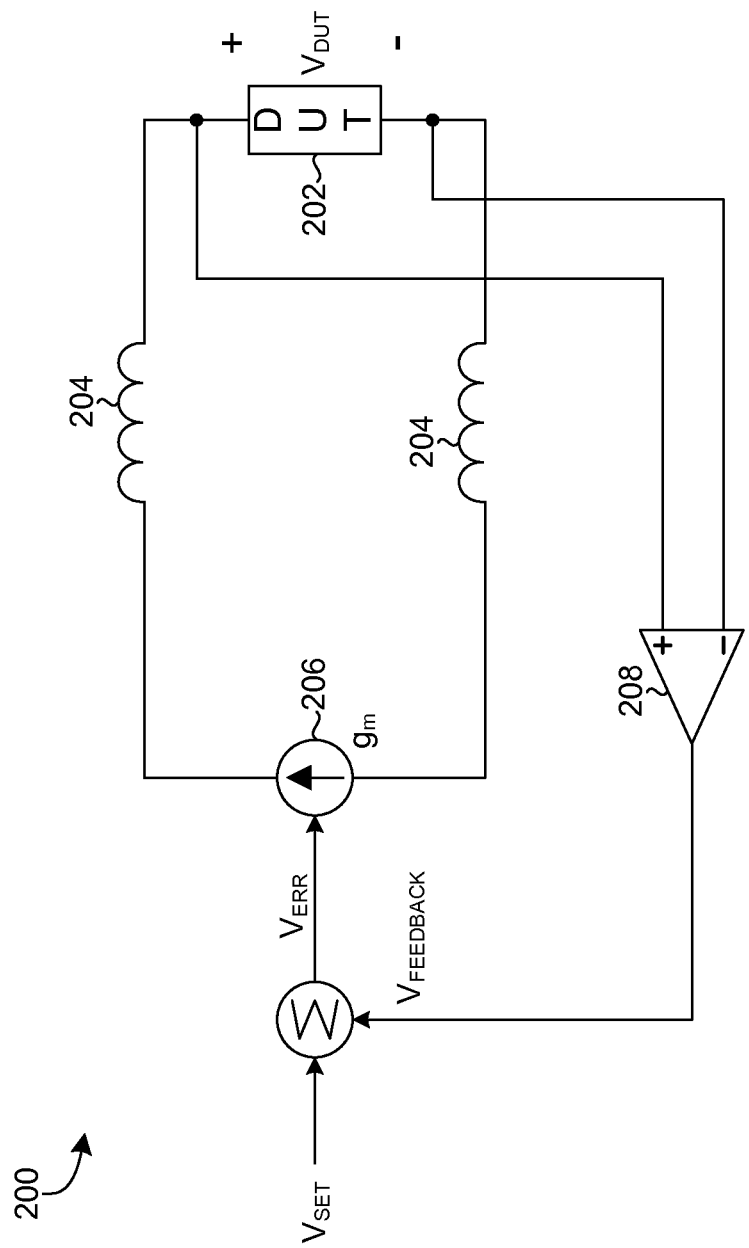
FIG. 2 illustrates a first example of a power supply arrangement in accordance with certain embodiments of the disclosed technology.

FIG. 2 illustrates a first example 200 of a power supply arrangement in accordance with certain embodiments of the disclosed technology. In the example 200, a DUT 202 has a voltage $V_{DUT}$ and an impedance $Z_{DUT}$. A cable connected to the DUT 202 has a cable inductance 204 that provides $L_{CABLE}$, and a voltage-controlled-current-source 206 provides transconductance gain $g_m$. A feedback voltage $V_{FEEDBACK}$ is provided by a feedback loop that includes an operational amplifier (op-amp) 208. In the example 200, $V_{FEEEDBACK}$, which is equal to $V_{DUT}$, is provided by the following:

$$V_{FEEDBACK=VDUT} = V_{ERR} * g_m * Z_{DUT}$$

Thus, the feedback voltage $V_{FEEDBACK}$ in the example is not a function of the cable inductance 204 of the cable connected to the DUT 202 and, consequently, there is significant loop stability.

A power supply in accordance with the disclosed technology is generally designed so that neither the transient response thereof nor its stability are affected by the cable or the load to which the cable is connected. Such a power supply generally consists of a high-bandwidth voltage-controlled-current-source for sending power over the load cables to the DUT. The stability and transient response may be set by the current sources gain, gm, and an external capacitor provided with the power supply and located close to the DUT, e.g., at the end of the cable.

The voltage-controlled-current-source is generally designed to have a specific, e.g., high, transconductance ($g_m$). The output impedance of the supply at direct current (DC) is generally equal to $1/g_m$, and the provided capacitor is typically a very good high-frequency capacitor of 10 uF in value, for example. The parasitics of the capacitor may be extremely small in order to dominate any parallel capacitance supplied by the DUT.

The bandwidth of the supply may be set by the $g_m$ of the voltage-controlled-current-source and the capacitance of the supplied capacitor in parallel with the capacitance of the DUT. The bandwidth frequency is generally equal to the $g_m/2p_i$/capacitance in Hz.

Figure 3:
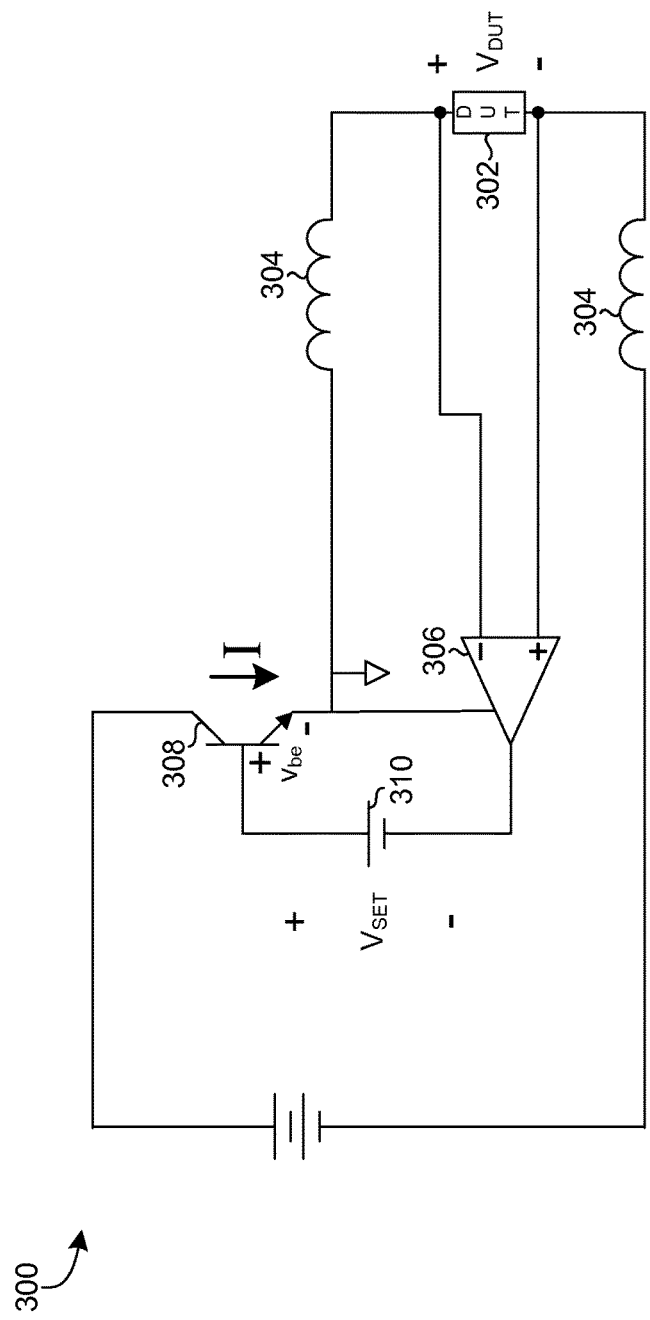
FIG. 3 illustrates a second example of a power supply arrangement in accordance with certain embodiments of the disclosed technology.

FIG. 3 illustrates a second example 300 of a power supply arrangement in accordance with certain embodiments of the disclosed technology. In the example 300, a DUT 302 has a voltage $V_{DUT}$ and an impedance $Z_{DUT}$, and a cable inductance 304 provides $L_{CABLE}$. In the example 300, an NPN transistor 308 is coupled with a voltage source 310 ($V_{set}$) and op-amp 306 and is modeled as a voltage-controlled-current-source to provide the following:

$$I = g_m * v_{be}.$$

Thus, $V_{DUT}$ is provided as follows:

$$V_{DUT} = g_m * v_{be} * Z_{DUT}$$

As with the power supply arrangement of FIG. 2, there is significant loop stability with the power supply arrangement of FIG. 3 due to the cable-independent nature of the topology. The DUT 302 may be highly capacitive in which case the power supply bandwidth will generally be defined by the gm of the voltage-controlled-current-source and the DUT capacitor.

Two performance measures for the disclosed power supplies are voltage droop to a current pulse and the time needed for such droop to recover. This is usually specified as transient response and is related to closed loop bandwidth of the power supply, e.g., higher bandwidth generally results in better transient response. A higher bandwidth is important for both performance criteria and usually results in having a high open-loop gain at higher frequencies, which reduces the output impedance of the power supply for fast current pulses. This generally results in a lower voltage droop.

High bandwidth also helps in that the closed-loop bandwidth relates directly to the voltage recovery time, e.g., higher bandwidth generally results in shorter recovery time. Typical requirements for testing a cellular phone include a low voltage droop, e.g., less than 50 mV, in response to a fast current pulse, e.g., 2 A, as well as recovery of the droop in voltage to its original value in less than a short period of time, e.g., 25 μsec. To meet such response, a power supply may be designed with a bandwidth of 200 kHz.

The stability may be set by the ability of the voltage-controlled-current-source to have a flat frequency response to a high frequency, e.g., greater than 5 MHz, and the supplied capacitor in parallel with the load capacitance. If the load capacitance is much bigger than the supplied capacitor, the bandwidth will generally be reduced by the increase in capacitance. If the load capacitor is highly resistive, or highly inductive, the capacitance of the supplied capacitor will typically dominate and define the stability.

In both of the scenarios described above, the bandwidth and the stability are advantageously unaffected by the inductance of the cable connected to the DUT; rather, they rely on the voltage-controlled-current-source and the supplied capacitor in parallel with the capacitance of the DUT.

Figure 4:
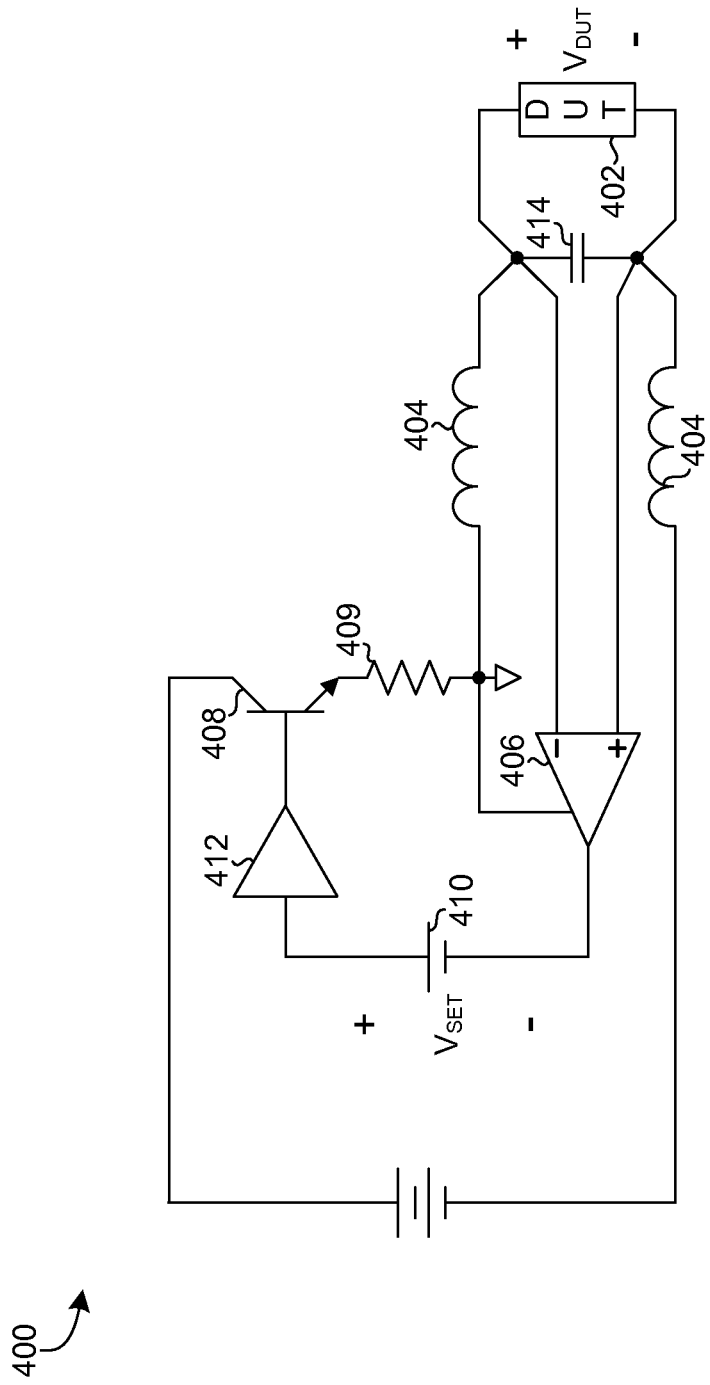
FIG. 4 illustrates a third example of a power supply arrangement in accordance with certain embodiments of the disclosed technology.

FIG. 4 illustrates a third example 400 of a power supply arrangement in accordance with certain embodiments of the disclosed technology. In the example 400, a DUT 402 has a voltage $V_{DUT}$ and an impedance $Z_{DUT}$, and a cable inductance 404 provides $L_{CABLE}$. In the example, the voltage-controlled-current-source consists of an NPN transistor 408 that is coupled with a resistor 409, a voltage source 410 ($V_{set}$), an amplifier 412, and an op-amp 406. The power supply arrangement of FIG. 4 is similar to the power supply arrangement of FIG. 3 except for the notable addition of the amplifier 412 and a capacitor 414 that is positioned close to the DUT 402 and is large enough to dominate the loop depending on the implementation. For example, if the capacitance of a cellular phone is 5-10 μF, then the value of the capacitor 414 should be 10 μF. In certain situations, the DUT 402 may exhibit a high-quality capacitor and there would be no need for the added capacitor 414. In this case, the $g_m$ of the voltage-controlled-current-source can be adjusted to achieve the desired bandwidth with the value of the DUT 402 capacitance.

Figure 5:
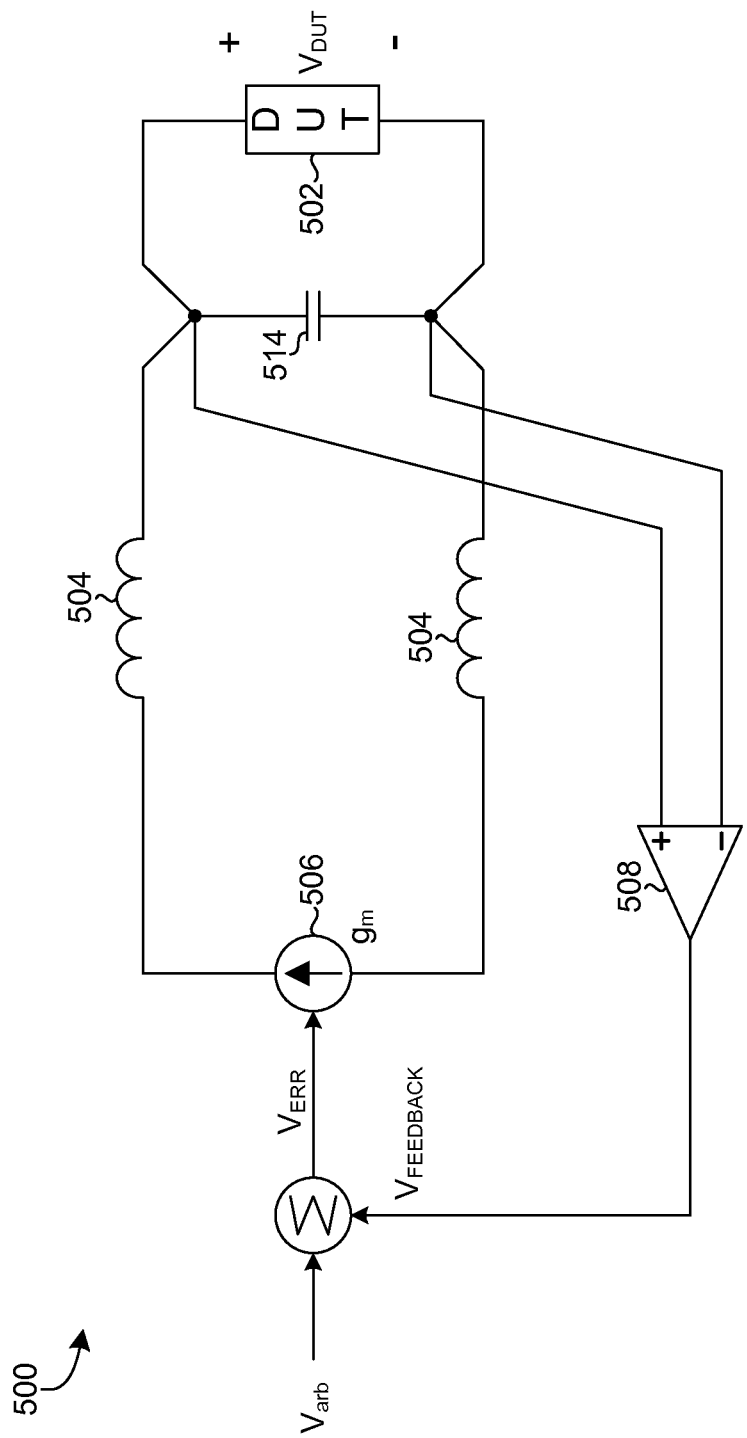
FIG. 5 illustrates a fourth example of a power supply arrangement in accordance with certain embodiments of the disclosed technology.

FIG. 5 illustrates a fourth example 500 of a power supply arrangement in accordance with certain embodiments of the disclosed technology. This fourth example 500 is similar to the first example 200 illustrated by FIG. 2 in that a DUT 502 has a voltage $V_{DUT}$ and an impedance $Z_{DUT}$, a cable connected to the DUT 502 has a cable inductance 504 that provides $L_{CABLE}$, a voltage-controlled-current-source 506 provides transconductance gain $g_m$, a feedback voltage $V_{FEEDBACK}$ is provided by a feedback loop that includes an op-amp 508, and a capacitor 514 is positioned close to the DUT 502. Unlike the first example 200, the fourth example 500 includes a voltage $V_{arb}$ from an arbitrary waveform generator. In this example 500, the arbitrary waveform $V_{arb}$ from the function generator may be delivered to the DUT 502 independent of the cabling inductance 504 and DUT 502 impedance $Z_{DUT}$.

Current function generators are generally low-power and of a certain output impedance. To get a clean signal out to a DUT it is usually necessary to have certain impedance cables and a matching termination impedance. Then, to get the signal to the DUT, a power buffer is generally used to reproduce the function to the DUT. Using implementations such as the example 500 illustrated by FIG. 5, however, the arbitrary waveform $V_{arb}$ may be advantageously provided directly to the DUT with little effect due to cabling and no need to buffer the signal.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A system for sourcing a voltage for a device under test (DUT), comprising:
   a voltage-controlled-current source (VCCS);
   a first cable coupled with a positive terminal of the VCCS configured to be coupled with a positive terminal of the DUT via a first cable end;
   a second cable coupled with a negative terminal of the VCCS configured to be coupled with a negative terminal of the DUT via a second cable end;
   a capacitor coupling the first cable to the second cable at a point between the VCCS and the first and second cable ends, the capacitor being independent of a capacitance of the DUT, wherein the capacitor is configured to dominate an open loop gain frequency roll-off through a gain of one, and wherein the capacitor is included in a voltage feedback loop for the VCCS such that a change in voltage across the capacitor causes a change in current provided by the VCCS.

2. The system of claim 1, further comprising a means to set and/or change a voltage supplied by the VCCS.

3. The system of claim 2, wherein the means to set and/or change the voltage supplied by the VCCS can be varied with time to produce an arbitrary voltage waveform.

4. The system of claim 1, wherein the VCCS includes:
   an amplifier electrically coupled between a voltage source and the capacitor; and
   an NPN transistor electrically coupled between the voltage source and the amplifier, wherein the NPN transistor has a deterministic transconductance.

5. The system of claim 4, wherein the transconductance can be adjusted.

6. The system of claim 4, wherein the NPN transistor is configured to provide the following: $I=g_m*v_{be}$, wherein I refers to a measured current of the NPN transistor, $g_m$ refers to a transconductance of the NPN transistor, and vbe refers to a voltage between a base and an emitter of the NPN transistor.

7. The system of claim 6, wherein the DUT has a voltage $V_{DUT}$ that is provided by the following: $V_{DUT}=g_m*v_{be}*Z_{DUT}$, wherein $g_m$ refers to the transconductance of the NPN transistor, $v_{be}$ refers to the voltage between the base and the emitter of the NPN transistor, and $Z_{DUT}$ refers to an impedance of the DUT.

8. The system of claim 4, further comprising a resistor electrically coupled between the NPN transistor and the capacitor.

9. The system of claim 1, wherein to dominate the open loop gain frequency, a size of the capacitor is based, at least in part, on the capacitance of the DUT.

10. The system of claim 1, wherein to dominate the open loop gain frequency, a size of the capacitor is based, at least in part, on a maximum capacitance of the DUT.

* * * * *